US012751111B2

(12) United States Patent
Owens et al.

(10) Patent No.: US 12,751,111 B2
(45) Date of Patent: Sep. 29, 2026

(54) FOCAL PLANE ARRAY

(71) Applicant: LG INNOTEK CO., LTD., Seoul (KR)

(72) Inventors: Mark Andrew Owens, Yardley, PA (US); John J. Vetick, II, East Windsor, NJ (US); Viorel C. Negoita, Princeton Junction, NJ (US); Junfu Chen, Dayton, NJ (US)

(73) Assignee: LG INNOTEK CO., LTD., Seoul (KR)

( * ) Notice: Subject to any disclaimer, the term of this patent is extended or adjusted under 35 U.S.C. 154(b) by 967 days.

(21) Appl. No.: 18/062,194

(22) Filed: Dec. 6, 2022

(65) Prior Publication Data

US 2024/0063312 A1 Feb. 22, 2024

Related U.S. Application Data

(60) Provisional application No. 63/399,264, filed on Aug. 19, 2022.

(51) Int. Cl.

| | |
|---|---|
| ***H10F 77/30*** | (2025.01) |
| ***G01S 7/486*** | (2020.01) |
| ***G01S 17/04*** | (2020.01) |
| ***G01S 17/89*** | (2020.01) |
| ***G01S 17/931*** | (2020.01) |
| ***G01S 17/933*** | (2020.01) |
| ***H10F 77/40*** | (2025.01) |

(52) U.S. Cl.

CPC ............ *H10F 77/334* (2025.01); *G01S 7/486* (2013.01); *G01S 17/04* (2020.01); *G01S 17/89* (2013.01); *G01S 17/931* (2020.01); *G01S 17/933* (2013.01); *H10F 77/40* (2025.01)

(58) Field of Classification Search

None

See application file for complete search history.

(56) References Cited

U.S. PATENT DOCUMENTS

| | | | | |
|---|---|---|---|---|
| 5,451,766 | A * | 9/1995 | Van Berkel ......... | H10F 39/8063 349/200 |
| 8,098,321 | B2 | 1/2012 | Shimoda et al. | |
| 2004/0146245 | A1 * | 7/2004 | Harwit ................. | G02B 6/4249 385/38 |
| 2014/0350836 | A1 * | 11/2014 | Stettner ................. | G01S 17/931 356/4.01 |

FOREIGN PATENT DOCUMENTS

| | | | | |
|---|---|---|---|---|
| CN | 209656895 U | 11/2019 | | |
| KR | 100538149 B1 | 12/2005 | | |
| WO | WO-2022056939 A1 * | 3/2022 | ............. | G06F 18/00 |

OTHER PUBLICATIONS

Translation.*

* cited by examiner

*Primary Examiner* — Luke D Ratcliffe

(74) *Attorney, Agent, or Firm* — Birch, Stewart, Kolasch & Birch, LLP

(57) ABSTRACT

In some implementations, a light blocking material may be applied to a photodetector comprising a microlens array (MLA) component and a photodiode array (PDA) component. The light blocking material may be applied to a first distal end of the MLA component and a second distal end of the MLA component.

12 Claims, 11 Drawing Sheets

800

| Band number | Distance (last pixel to middle of band) |
|---|---|
| 1st band | 0.13 mm |
| 2nd band | 0.38 mm |
| 3rd band | 0.62 mm |
| 4th band | 1.0 mm |

FOCAL PLANE ARRAY

CROSS-REFERENCE TO RELATED APPLICATION

This patent application claims priority to U.S. Provisional Patent Application No. 63/399,264, filed on Aug. 19, 2022, entitled "FOCAL PLANE ARRAY," and assigned to the assignee hereof. The disclosure of the prior application is considered part of and is incorporated by reference into this patent application.

BACKGROUND

An autonomous vehicle (or AV) is a vehicle having a processor, programming instructions, and drivetrain components that are controllable by the processor without requiring a human operator. An autonomous vehicle may be fully autonomous in that the autonomous vehicle does not require a human operator for most or all driving conditions and functions, or an autonomous vehicle may be semi-autonomous in that a human operator may be required in certain conditions or for certain operations, or that a human operator may override the autonomous vehicle's autonomous system and may take control of the autonomous vehicle.

SUMMARY

In some implementations, a photodetector includes a microlens array (MLA) component; a photodiode array (PDA) component; and light blocking material applied at a first distal end of the MLA component, and a second distal end of the MLA component.

In some implementations, a method includes attaching a photodetector to an interposer, the photodetector comprising: an MLA component, and a PDA component; applying a light blocking material to a first distal end of the MLA component; and applying the light blocking material to a second distal end of the MLA component.

In some implementations, a lidar system includes a photodetector, comprising: an MLA component, a PDA component, and light blocking material applied at a first distal end of the MLA component, and a second distal end of the MLA component; a memory; and at least one processor coupled to the memory and configured to: receive input from the photodetector; and generate a lidar point cloud based at least in part on the input.

DETAILED DESCRIPTION

Figure 1:
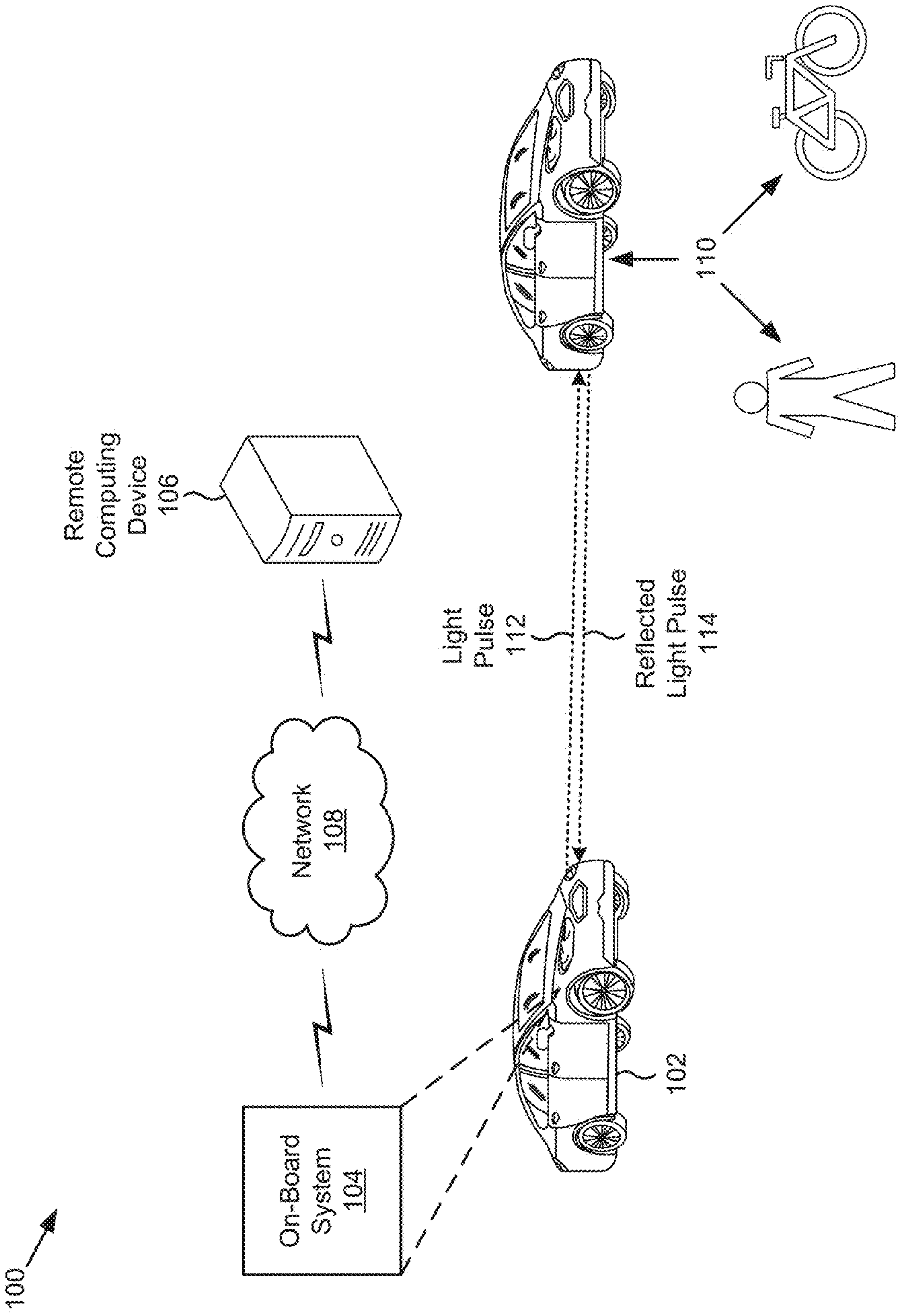
FIG. 1 is a diagram of an example environment in which an autonomous vehicle may operate, in accordance with some aspects of the disclosure.

The following detailed description of example implementations refers to the accompanying drawings, which are incorporated herein and form a part of the specification. The same reference numbers in different drawings may identify the same or similar elements. In general, the left-most digit(s) of a reference number identifies the drawing in which the reference number first appears.

Photodetectors, or focal plane arrays, are sensors that may be used to receive light and convert the light into electrical signals. Photodetectors may be used in a variety of contexts, including within a lidar system that may be included in an autonomous vehicle to facilitate control and navigation of the autonomous vehicle. A lidar system may emit pulses of light, receive reflected light, analyze the received light, and provide output that may be further processed or otherwise used by other systems associated with the autonomous vehicle. In some situations, stray light may be detected by a photodetector of a lidar system (e.g., due to reflections from out-of-field objects, internal lidar system components, and/or the like), which may cause the photodetector to produce output associated with unwanted stray light. For example, stray light may cause artifacts, bloom, false objects, and/or other unwanted noise in the photodetector output. Accordingly, stray light may reduce the accuracy and usefulness of the output produced by a photodetector and/or lidar system, which may lead to a variety of issues for the analysis and use of the output, including false object detection, lower object detection accuracy and/or precision, and/or the like.

Some implementations described herein prevent stray light from entering or otherwise interfering with a photodetector, or focal plane array. For example, and as described further herein, a photodetector may include a microlens array (MLA) component and a photodiode array (PDA) component, and a light blocking material may be applied at distal ends of at least the MLA component. The light blocking material may block stray light from entering the MLA and/or PDA. This may prevent the photodetector, and any associated lidar system, from sensing and producing output associated with the stray light, which may reduce, for example, unwanted coupling and the appearance of artifacts, false objects, and/or other unwanted noise in a lidar point cloud output from the lidar system. As a result, by preventing stray light from being detected by the photodetector, a lidar system (or other system receiving output from the photodetector) may have improved accuracy, fewer false object detections, higher precision, and/or the like. When used in the context of autonomous vehicles, this may lead to safer, more precise, and more accurate control, navigation, and/or collision avoidance, among other examples.

FIG. 1 is a diagram of an example environment 100 in which an autonomous vehicle may operate, in accordance with some aspects of the disclosure. The environment 100 may include, for example, a vehicle 102, an on-board system 104 of the vehicle 102, a remote computing device 106, and/or a network 108. As further shown, the environment 100 may include one or more objects 110 that the vehicle 102 is configured to detect.

The vehicle 102 may include any moving form of conveyance that is capable of carrying one or more human occupants and/or cargo and that is powered by any form of energy. The vehicle 102 may include, for example, a land vehicle (e.g., a car, a truck, a van, or a train), an aircraft (e.g., an unmanned aerial vehicle or a drone), or a watercraft. In the example of FIG. 1, the vehicle 102 is a land vehicle and is shown as a car. Furthermore, the vehicle 102 is an autonomous vehicle in the example of FIG. 1. An autonomous vehicle (or AV) is a vehicle having a processor, programming instructions, and drivetrain components that are controllable by the processor without requiring a human operator. An autonomous vehicle may be fully autonomous in that the autonomous vehicle does not require a human operator for most or all driving conditions and functions, or an autonomous vehicle may be semi-autonomous in that a human operator may be required in certain conditions or for certain operations, or that a human operator may override the autonomous vehicle's autonomous system and may take control of the autonomous vehicle.

As shown in FIG. 1, the vehicle 102 may include an on-board system 104 that is integrated into and/or coupled with the vehicle 102. In general, the on-board system 104 may be used to control the vehicle 102, to sense information about the vehicle 102 and/or an environment in which the vehicle 102 operates, to detect one or more objects 110 in the proximity of the vehicle, to provide output to or receive input from an occupant of the vehicle 102, and/or to communicate with one or more devices remote from the vehicle 102, such as another vehicle and/or the remote computing device 106. The on-board system 104 is described in more detail below in connection with FIG. 2.

In some implementations, the vehicle 102 may travel along a road in a semi-autonomous or autonomous manner. The vehicle 102 may be configured to detect objects 110 in proximity of the vehicle 102. An object 110 may include, for example, another vehicle (e.g., an autonomous vehicle or a non-autonomous vehicle that requires a human operator for most or all driving conditions and functions), a cyclist (e.g., a rider of a bicycle, electric scooter, or motorcycle), a pedestrian, a road feature (e.g., a roadway boundary, a lane marker, a sidewalk, a median, a guard rail, a barricade, a sign, a traffic signal, a railroad crossing, or a bike path), and/or another object that may be on a roadway or in proximity of a roadway, such as a tree or an animal.

To detect objects 110, the vehicle 102 may be equipped with one or more sensors, such as a lidar system, as described in more detail elsewhere herein. The lidar system may be configured to transmit a light pulse 112 to detect objects 110 located within a distance or range of distances of the vehicle 102. The light pulse 112 may be incident on an object 110 and may be reflected back to the lidar system as a reflected light pulse 114. The reflected light pulse 114 may be incident on the lidar system and may be processed to determine a distance between the object 110 and the vehicle 102. The reflected light pulse 114 may be detected using, for example, a photodetector or an array of photodetectors, which may include a focal plane array, positioned and configured to receive the reflected light pulse 114. In some implementations, a lidar system may be included in another system other than a vehicle 102, such as a robot, a satellite, and/or a traffic light, or may be used as a standalone system. Furthermore, implementations described herein are not limited to autonomous vehicle applications and may be used in other applications, such as robotic applications, radar system applications, metric applications, and/or system performance applications.

The lidar system may provide lidar data, such as information about a detected object 110 (e.g., information about a distance to the object 110, a speed of the object 110, and/or a direction of movement of the object 110), to one or more other components of the on-board system 104. Additionally, or alternatively, the vehicle 102 may transmit lidar data to the remote computing device 106 (e.g., a server, a cloud computing system, and/or a database) via the network 108. The remote computing device 106 may be configured to process the lidar data and/or to transmit a result of processing the lidar data to the vehicle 102 via the network 108.

The network 108 may include one or more wired and/or wireless networks. For example, the network 108 may include a wireless wide area network (e.g., a cellular network or a public land mobile network), a local area network (e.g., a wired local area network or a wireless local area network (WLAN), such as a Wi-Fi network), a personal area network (e.g., a Bluetooth network), a near-field communication network, a telephone network, a private network, the Internet, and/or a combination of these or other types of networks. The network 108 enables communication among the devices of environment 100.

As indicated above, FIG. 1 is provided as an example. Other examples may differ from what is described with regard to FIG. 1. The number and arrangement of devices shown in FIG. 1 are provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Figure 2:
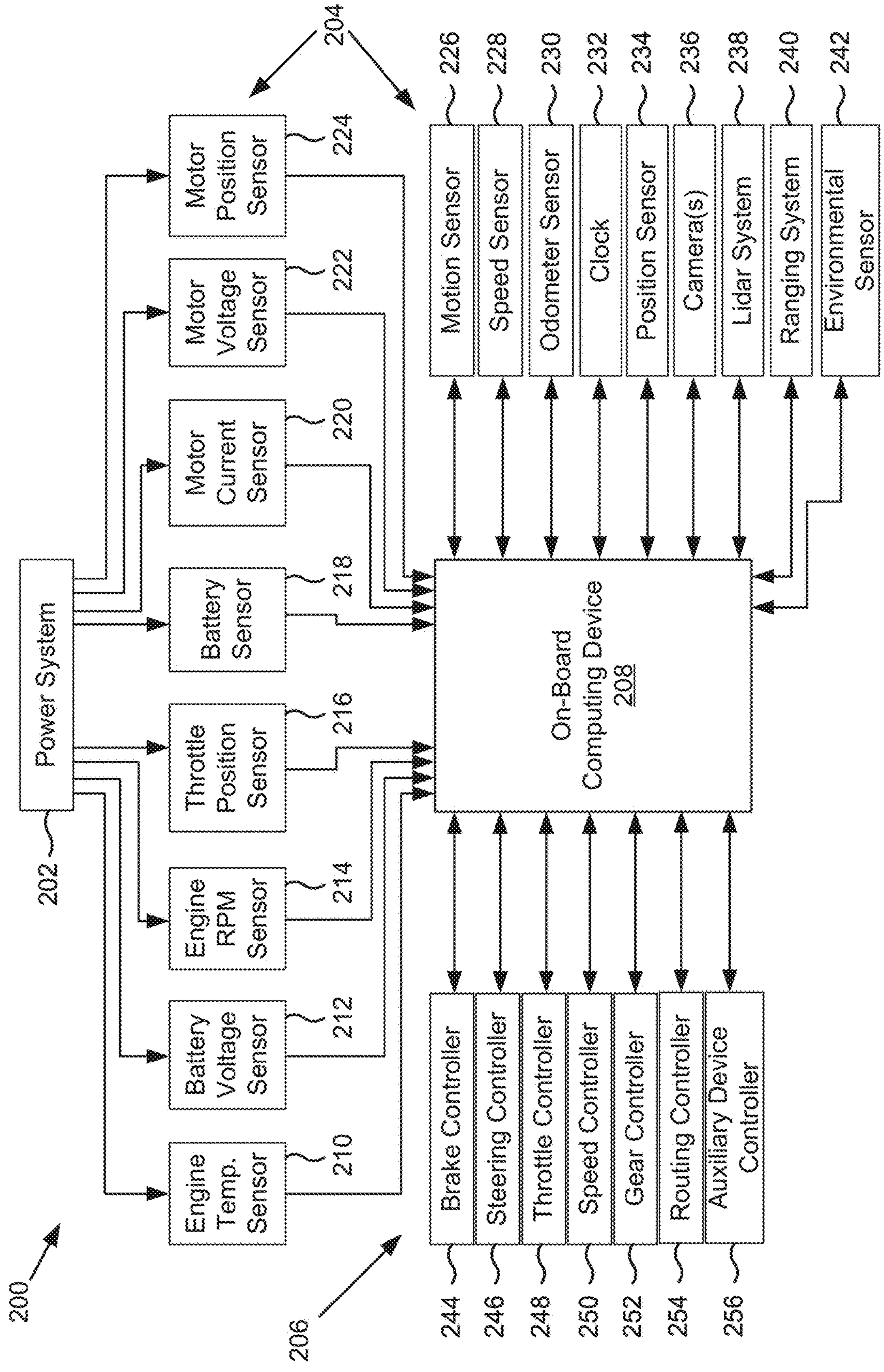
FIG. 2 is a diagram of an example on-board system of an autonomous vehicle, in accordance with some aspects of the disclosure.

FIG. 2 is a diagram of an example on-board system 200 of an autonomous vehicle, in accordance with some aspects of the disclosure. In some implementations, the on-board system 200 may correspond to the on-board system 104 included in the vehicle 102, as described above in connection with FIG. 1. As shown in FIG. 2, the on-board system 200 may include one or more of the illustrated components 202-256. The components of the on-board system 200 may include, for example, a power system 202, one or more sensors 204, one or more controllers 206, and/or an on-board computing device 208. The components of the on-board system 200 may communicate via a bus (e.g., one or more wired and/or wireless connections), such as a controller area network (CAN) bus.

The power system 202 may be configured to generate mechanical energy for the vehicle 102 to move the vehicle 102. For example, the power system 202 may include an engine that converts fuel to mechanical energy (e.g., via combustion) and/or a motor that converts electrical energy to mechanical energy.

The one or more sensors 204 may be configured to detect operational parameters of the vehicle 102 and/or environmental conditions of an environment in which the vehicle 102 operates. For example, the one or more sensors 204 may include an engine temperature sensor 210, a battery voltage sensor 212, an engine rotations per minute (RPM) sensor 214, a throttle position sensor 216, a battery sensor 218 (to measure current, voltage, and/or temperature of a battery), a motor current sensor 220, a motor voltage sensor 222, a motor position sensor 224 (e.g., a resolver and/or encoder), a motion sensor 226 (e.g., an accelerometer, gyroscope and/or inertial measurement unit), a speed sensor 228, an odometer sensor 230, a clock 232, a position sensor 234 (e.g., a global navigation satellite system (GNSS) sensor and/or a global positioning satellite (GPS) sensor), one or more cameras 236, a lidar system 238, one or more other ranging systems 240 (e.g., a radar system and/or a sonar system), and/or an environmental sensor 242 (e.g., a precipitation sensor and/or ambient temperature sensor).

The one or more controllers 206 may be configured to control operation of the vehicle 102. For example, the one or more controllers 206 may include a brake controller 244 to control braking of the vehicle 102, a steering controller 246 to control steering and/or direction of the vehicle 102, a throttle controller 248 and/or a speed controller 250 to control speed and/or acceleration of the vehicle 102, a gear controller 252 to control gear shifting of the vehicle 102, a routing controller 254 to control navigation and/or routing of the vehicle 102 (e.g., using map data), and/or an auxiliary device controller 256 to control one or more auxiliary devices associated with the vehicle 102, such as a testing device, an auxiliary sensor, and/or a mobile device transported by the vehicle 102.

The on-board computing device 208 may be configured to receive sensor data from one or more sensors 204 and/or to provide commands to one or more controllers 206. For example, the on-board computing device 208 may control operation of the vehicle 102 by providing a command to a controller 206 based on sensor data received from a sensor 204. In some implementations, the on-board computing device 208 may be configured to process sensor data to generate a command. The on-board computing device 208 may include memory, one or more processors, an input component, an output component, and/or a communication component, as described in more detail elsewhere herein.

As an example, the on-board computing device 208 may receive navigation data, such as information associated with a navigation route from a start location of the vehicle 102 to a destination location for the vehicle 102. In some implementations, the navigation data is accessed and/or generated by the routing controller 254. For example, the routing controller 254 may access map data and identify possible routes and/or road segments that the vehicle 102 can travel to move from the start location to the destination location. In some implementations, the routing controller 254 may identify a preferred route, such as by scoring multiple possible routes, applying one or more routing techniques (e.g., minimum Euclidean distance, Dijkstra's algorithm, and/or Bellman-Ford algorithm), accounting for traffic data, and/or receiving a user selection of a route, among other examples. The on-board computing device 208 may use the navigation data to control operation of the vehicle 102.

As the vehicle travels along the route, the on-board computing device 208 may receive sensor data from various sensors 204. For example, the position sensor 234 may provide geographic location information to the on-board computing device 208, which may then access a map associated with the geographic location information to determine known fixed features associated with the geographic location, such as streets, buildings, stop signs, and/or traffic signals, which may be used to control operation of the vehicle 102.

In some implementations, the on-board computing device 208 may receive one or more images captured by one or more cameras 236, may analyze the one or more images (e.g., to detect object data), and may control operation of the vehicle 102 based on analyzing the images (e.g., to avoid detected objects). Additionally, or alternatively, the on-board computing device 208 may receive object data associated with one or more objects detected in a vicinity of the vehicle 102 and/or may generate object data based on sensor data. The object data may indicate the presence of absence of an object, a location of the object, a distance between the object and the vehicle 102, a speed of the object, a direction of movement of the object, an acceleration of the object, a trajectory (e.g., a heading) of the object, a shape of the object, a size of the object, a footprint of the object, and/or a type of the object (e.g., a vehicle, a pedestrian, a cyclist, a stationary object, or a moving object). The object data may be detected by, for example, one or more cameras 236 (e.g., as image data), the lidar system 238 (e.g., as lidar data) and/or one or more other ranging systems 240 (e.g., as radar data or sonar data). The on-board computing device 208 may process the object data to detect objects in proximity of the vehicle 102 and/or to control operation of the vehicle 102 based on the object data (e.g., to avoid detected objects).

In some implementations, the on-board computing device 208 may use the object data (e.g., current object data) to predict future object data for one or more objects. For example, the on-board computing device 208 may predict a future location of an object, a future distance between the object and the vehicle 102, a future speed of the object, a future direction of movement of the object, a future acceleration of the object, and/or a future trajectory (e.g., a future heading) of the object. For example, if an object is a vehicle and map data indicates that the vehicle is at an intersection, then the on-board computing device 208 may predict whether the object will likely move straight or turn. As another example, if the sensor data and/or the map data indicates that the intersection does not have a traffic light, then the on-board computing device 208 may predict whether the object will stop prior to entering the intersection.

The on-board computing device 208 may generate a motion plan for the vehicle 102 based on sensor data, navigation data, and/or object data (e.g., current object data and/or future object data). For example, based on current locations of objects and/or predicted future locations of objects, the on-board computing device 208 may generate a motion plan to move the vehicle 102 along a surface and avoid collision with other objects. In some implementations, the motion plan may include, for one or more points in time, a speed of the vehicle 102, a direction of the vehicle 102, and/or an acceleration of the vehicle 102. Additionally, or alternatively, the motion plan may indicate one or more actions with respect to a detected object, such as whether to overtake the object, yield to the object, pass the object, or the like. The on-board computing device 208 may generate one or more commands or instructions based on the motion plan, and may provide those command(s) to one or more controllers 206 for execution.

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single components, or a single components shown in FIG. 2 may be implemented as multiple, distributed components. Additionally, or alternatively, a set of components (e.g., one or more components) shown in FIG. 2 may perform one or more functions described as being performed by another set of components shown in FIG. 2. For example, although some components of FIG. 2 are primarily associated with land vehicles, other types of vehicles are within the scope of the disclosure. As an example, an on-board system of an aircraft may not include the brake controller 244 and/or the gear controller 252, but may include an altitude sensor. As another example, an on-board system of a watercraft may include a depth sensor.

Figure 3:
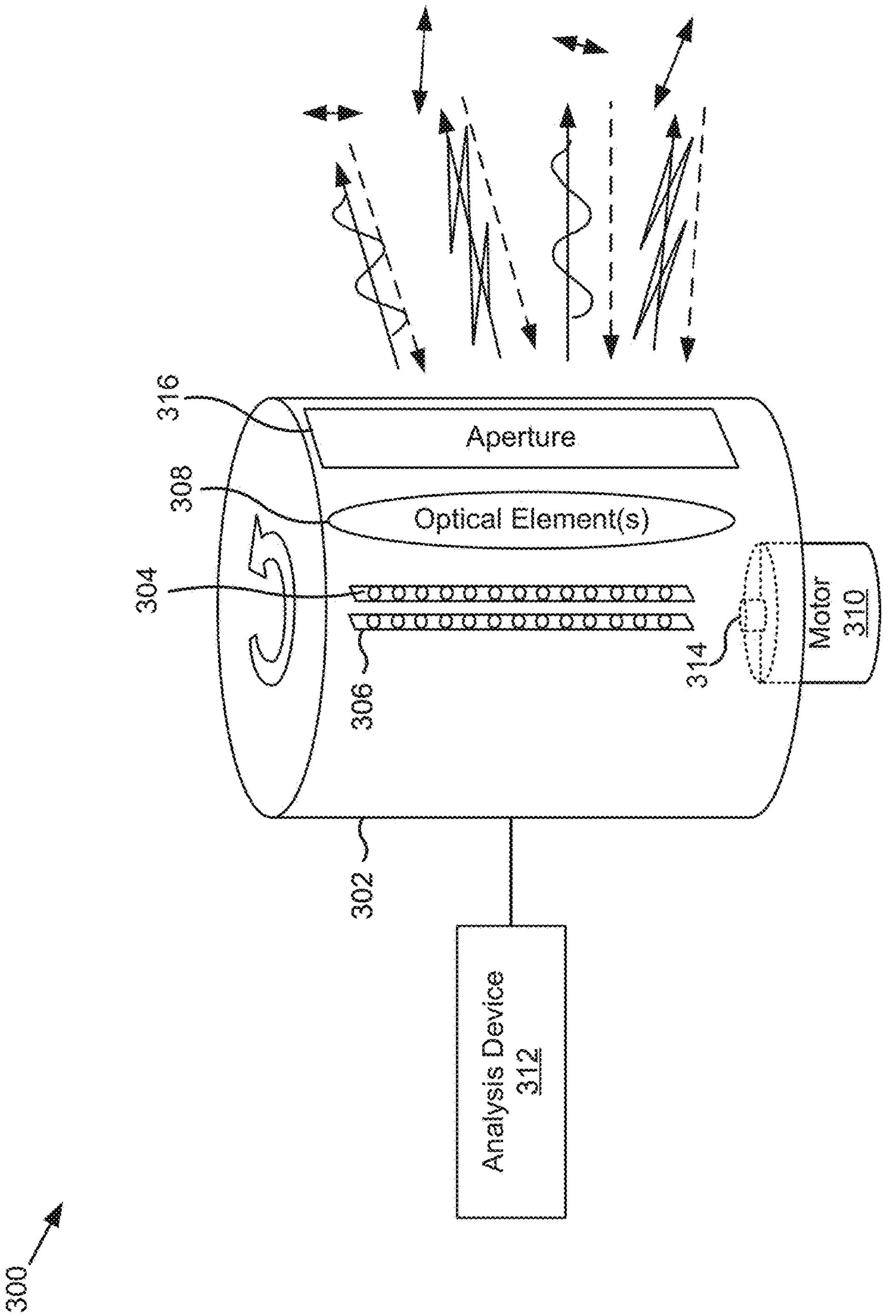
FIG. 3 is a diagram of an example lidar system, in accordance with some aspects of the disclosure.

FIG. 3 is a diagram of an example lidar system 300, in accordance with some aspects of the disclosure. In some implementations, the lidar system 300 may correspond to the lidar system 238 of FIG. 2. As shown in FIG. 3, the lidar system may include a housing 302, a light emitter system 304, a light detector system 306, an optical element structure 308, a motor 310, and an analysis device 312.

The housing 302 may be rotatable (e.g., by 360 degrees) around an axle 314 (or hub) of the motor 310. The housing 302 may include an aperture 316 (e.g., an emitter and/or receiver aperture) made of a material transparent to light. Although a single aperture 316 is shown in FIG. 3, the housing 302 may include multiple apertures 316 in some implementations. The lidar system 300 may emit light through one or more apertures 316 and may receive reflected light back through one or more apertures 316 as the housing 302 rotates around components housed within the housing 302. Alternatively, the housing 302 may be a stationary structure (e.g., that does not rotate), at least partially made of a material that is transparent to light, with rotatable components inside of the housing 302.

The housing 302 may house the light emitter system 304, the light detector system 306, and/or the optical element structure 308. The light emitter system 304 may be configured and/or positioned to generate and emit pulses of light through the aperture 316 and/or through transparent material of the housing 302. For example, the light emitter system 304 may include one or more light emitters, such as laser emitter chips or other light emitting devices. The light emitter system 304 may include any number of individual light emitters (e.g., 8 emitters, 64 emitters, or 128 emitters), which may emit light at substantially the same intensity or of varying intensities. The light detector system 306 may include a photodetector or an array of photodetectors, such as a photodiode array or focal plane array, configured and/or positioned to receive light reflected back through the housing 302 and/or the aperture 316.

The optical element structure 308 may be positioned between the light emitter system 304 and the housing 302, and/or may be positioned between the light detector system 306 and the housing 302. The optical element structure 308 may include one or more lenses, waveplates, and/or mirrors that focus and direct light that passes through the optical element structure 308. The light emitter system 304, the light detector system 306, and/or the optical element structure 308 may rotate with a rotatable housing 302 or may rotate inside of a stationary housing 302.

The analysis device 312 may be configured to receive (e.g., via one or more wired and/or wireless connections) sensor data collected by the light detector system 306, analyze the sensor data to measure characteristics of the received light, and generate output data based on the sensor data. In some implementations, the analysis device 312 may provide the output data to another system that can control operations and/or provide recommendations with respect to an environment from which the sensor data was collected. For example, the analysis device 312 may provide the output data to the on-board system 104 (e.g., the on-board computing device 208) of the vehicle 102 to enable the on-board system 104 to process the output data and/or use the output data (or the processed output data) to control operation of the vehicle 102. The analysis device 312 may be integrated into the lidar system 300 or may be external from the lidar system 300 and communicatively connected to the lidar system 300 via a network. The analysis device 312 may include memory, one or more processors, an input component, an output component, and/or a communication component, as described in more detail elsewhere herein.

As indicated above, FIG. 3 is provided as an example. Other examples may differ from what is described with regard to FIG. 3. The number and arrangement of components shown in FIG. 3 are provided as an example. In practice, there may be additional components, fewer components, different components, or differently arranged components than those shown in FIG. 3. Furthermore, two or more components shown in FIG. 3 may be implemented within a single components, or a single components shown in FIG. 3 may be implemented as multiple, distributed components. Additionally, or alternatively, a set of components (e.g., one or more components) shown in FIG. 3 may perform one or more functions described as being performed by another set of components shown in FIG. 3.

Figure 4:
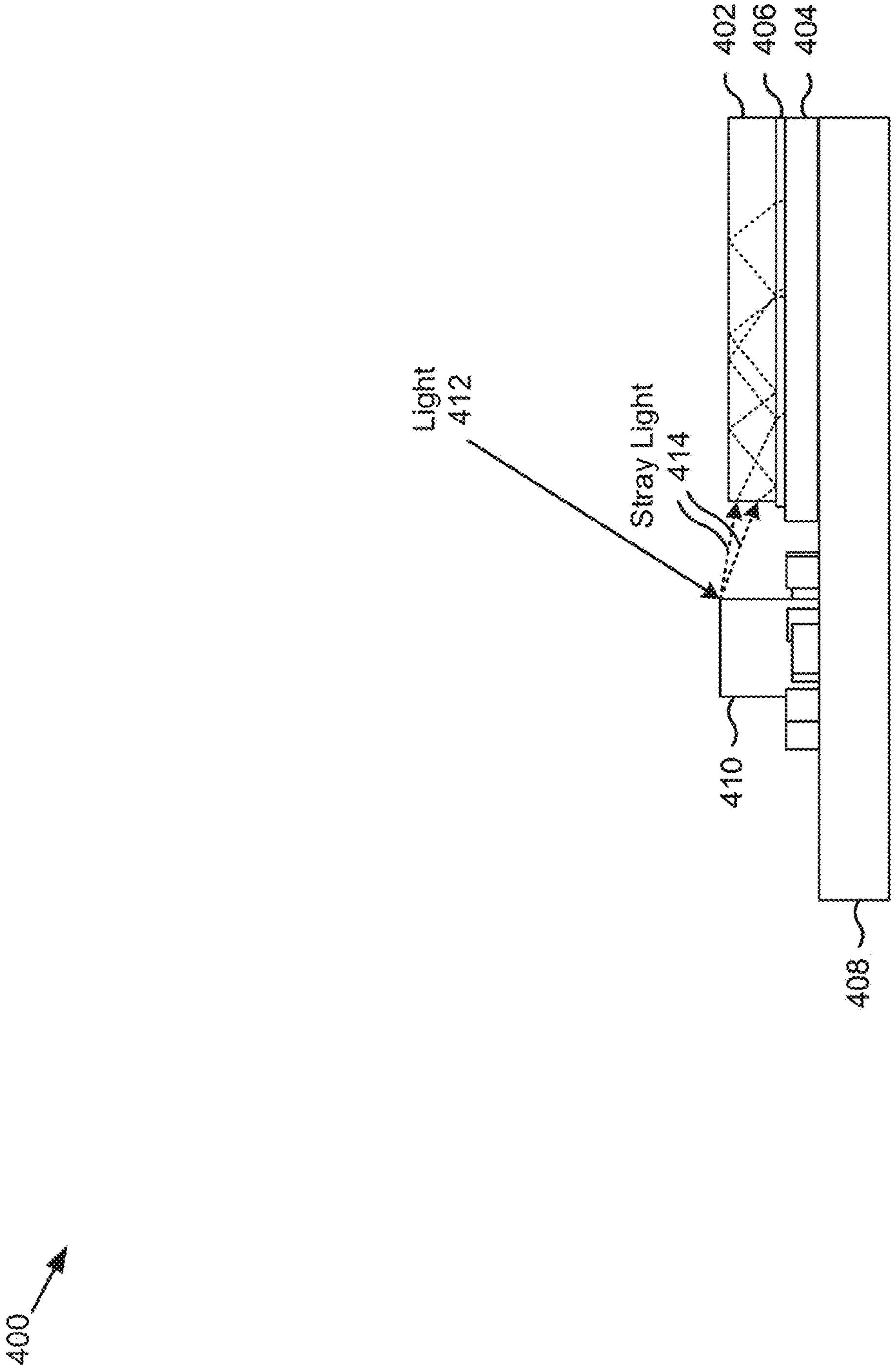
FIG. 4 is a diagram depicting a side-view of example components of a lidar system with light incident thereon, in accordance with some aspects of the disclosure.

FIG. 4 is a diagram depicting a side-view 400 of example components of a lidar system (e.g., lidar system 300) with light incident thereon, in accordance with some aspects of the disclosure. As shown in FIG. 4, example 400 depicts a microlens array (MLA) 402 (e.g., an optical element structure 308), a photodiode array (PDA) 404 (e.g., a light detector system 306), a standoff 406 between the MLA 402 and PDA 404, an interposer component 408, and other components 410. The standoff 406 may be a component to facilitate a connection between the MLA 402 and PDA 404, such as a polymer (e.g., a photolithographic polymer). In some aspects, the standoff 406 may be included in a gap, trench, or other feature(s) of the MLA 402 and/or PDA 404 that facilitates connecting the MLA 402 and the PDA 404. The interposer component 408 may be any suitable component to provide mechanical support for and/or an electrical interface between the various components of the lidar system 300, and the interposer 408 may be formed of silicon, glass, and/or an organic substrate, among other examples.

As described herein, a lidar system 300 may emit pulses of light, receive reflected light (e.g., via MLA and PDA), analyze the received light, and provide output that may be processed or otherwise used by other systems (e.g., in a vehicle). In some situations, light 412, which may include reflected light and/or other light entering an aperture of the lidar system 300, may be incident on and/or reflected by other components 410 of the lidar system 300. This may cause stray light 414 to enter the MLA and/or PDA, which may cause the lidar system 300 to sense and produce output associated with the unwanted light. For example, some lidar systems 300 may produce output in the form of a lidar point cloud indicating the intensity of reflected light, and stray light 414 may cause artifacts, false objects, and/or other unwanted noise in the lidar point cloud output. In some lidar systems, even a single photon of unwanted stray light 414 may cause false objects to appear in a lidar point cloud or other output produced by the lidar system 300. Accordingly, stray light 414 may reduce the accuracy and usefulness of the output produced by the lidar system 300, which may lead to a variety of issues for the analysis and use of the output, including false object detection, lower object detection accuracy and/or precision, and/or the like.

As indicated above, FIG. 4 is provided as an example. Other examples may differ from what is described with regard to FIG. 4. The number and arrangement of devices shown in FIG. 4 are provided as an example. In practice, there may be additional devices, fewer devices, different devices, or differently arranged devices than those shown in FIG. 4.

Figure 5:
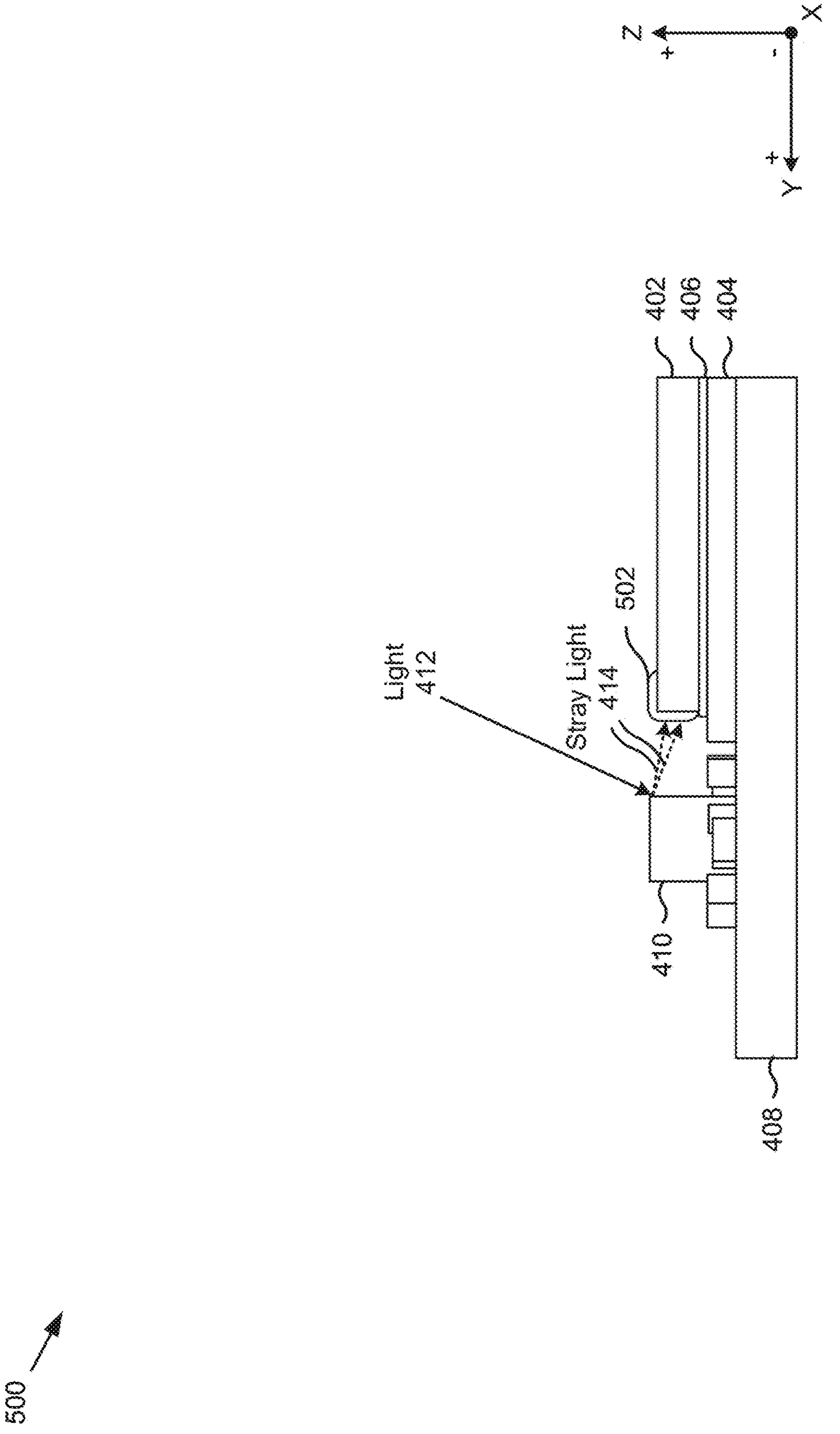
FIG. 5 is a diagram of an example implementation associated with blocking stray light associated with a lidar system, in accordance with some aspects of the disclosure.

FIG. 5 is a diagram of an example implementation 500 associated with blocking stray light associated with a lidar system (e.g., lidar system 300), in accordance with some aspects of the disclosure. As shown in FIG. 5, example implementation 500 depicts an MLA 402 (e.g., an optical element structure 308), a PDA 404 (e.g., a light detector system 306), a standoff 406 between the MLA 402 and PDA 404, an interposer component 408, other components 410, and a light blocking material 502.

In some aspects, the light blocking material 502 may include any material capable of blocking infrared light. For example, the light blocking material 502 may include a solid or viscous material. In some aspects, the light blocking material 502 is capable of blocking short-wave infrared light (e.g., 1400 nm to 3000 nm wavelength), among other examples. In some aspects, the light blocking material 502 may comprise a viscous and adhesive ultraviolet (UV) curable polymer.

In some aspects, the light blocking material 502 is applied to an end of the MLA 402. For example, the light blocking material 502 may be applied on top of the MLA 402 and to an end face of the MLA 402, as shown in the example implementation 500. In some aspects, the light blocking material 502 may extend further in the X direction, such that the light blocking material 502 is applied across a top surface of the PDA 404. In some aspects, the light blocking material 502 may not extend, in the X direction, to cover a side face of the MLA 402, PDA 404, and/or the standoff 406, such that side faces of the MLA 402, PDA 404, and/or standoff 406 remain clear of the light blocking material 502. In some aspects, the light blocking material 502 may extend further in the Y direction, such that the light blocking material 502 extends over the end face of the MLA 402, the PDA 404, and/or the standoff 406. In some aspects, the light blocking material 502 may not extend in the +Y direction to come into contact with any of the other components 410 of the lidar system 300, or in the −Y direction to cover a microlens and/or pixel region of the MLA 402. In some aspects, the light blocking material 502 may extend further in the Z direction, such that the light blocking material 502 is applied to an end face of the PDA 404 and/or the standoff 406 and may further extend to the interposer 408.

In some aspects, the light blocking material 502 may be applied to avoid covering fiducials of the MLA 402, PDA 404, or other components. For example, and as depicted in further detail in FIGS. 6-8, various features of the MLA 402 and/or PDA 404 may be covered by the light blocking material 502, while some features are left uncovered. In some aspects, the light blocking material 502 may be disposed within a gap between the MLA 402 and PDA 404. For example, the MLA 402 and/or PDA 404 may include a trench or other feature that results in a gap between the MLA 402 and PDA 404. At least a portion of the gap may be filled with the standoff 406, and other portions of the gap may be filled with the light blocking material 502. In some aspects, the light blocking material 502 within the gap may come into contact with the standoff 406, preventing the light blocking material 502 from seeping into contact with portions of the MLA 402 and/or PDA 404 that would interfere with the functionality of the components.

In some cases, such as when the light blocking material 502 is a solid material, the light blocking material 502 may be pre-formed and attached to the MLA 402 and/or PDA 404 during or after assembly of the lidar system. For example, a solid light-blocking material 502 may be fastened to one or more components of the lidar system with one or more physical fasteners and/or an adhesive material, among other examples. In some cases, such as when the light blocking material 502 is viscous, the light blocking material 502 may be applied via a dispenser, brush, or other form of applicator, manually or via electro-mechanical means, during or after assembly of the lidar system. For example, the light blocking material 502 may be applied, starting at a top surface of the MLA 402, by dragging an applicator in the +Y direction, allowing the viscous light blocking material to flow over the edge face of the MLA 402 and, in some aspects, over portions of the PDA 404, standoff 406, and/or interposer 408, as described herein. In this example, the light blocking material 502 may be cured using UV light after it is applied.

As shown in the example embodiment 500, the light blocking material 502 may block stray light 414 from entering the MLA 402 and/or PDA 404. This may prevent the lidar system from sensing and producing output associated with the unwanted light (e.g., stray light 414), which may reduce, for example, unwanted coupling and the appearance of artifacts, false objects, and/or other unwanted noise in a lidar point cloud output from the lidar system. As described herein, even a single photon of stray light 414 may cause false objects to appear in a lidar point cloud or other output produced by the lidar system. Accordingly, by preventing stray light 414 from being detected by the lidar system, the lidar system may have improved accuracy, fewer false object detections, higher precision, and/or the like. When used in the context of autonomous vehicles, this may lead to safer and more accurate control, navigation, and/or the like.

As indicated above, FIG. 5 is provided as an example. Other examples may differ from what is described with regard to FIG. 5. The number and arrangement of devices shown in FIG. 5 are provided as an example. In practice, there may be additional devices, fewer devices, different devices, or differently arranged devices than those shown in FIG. 5. While FIG. 5 only depicts one edge of an MLA 402 and PDA 404, light blocking material 502 may also be applied to other portions of the lidar system, such as on another edge of the MLA 402 and/or PDA 404 opposite the depicted edge.

Figure 6A:
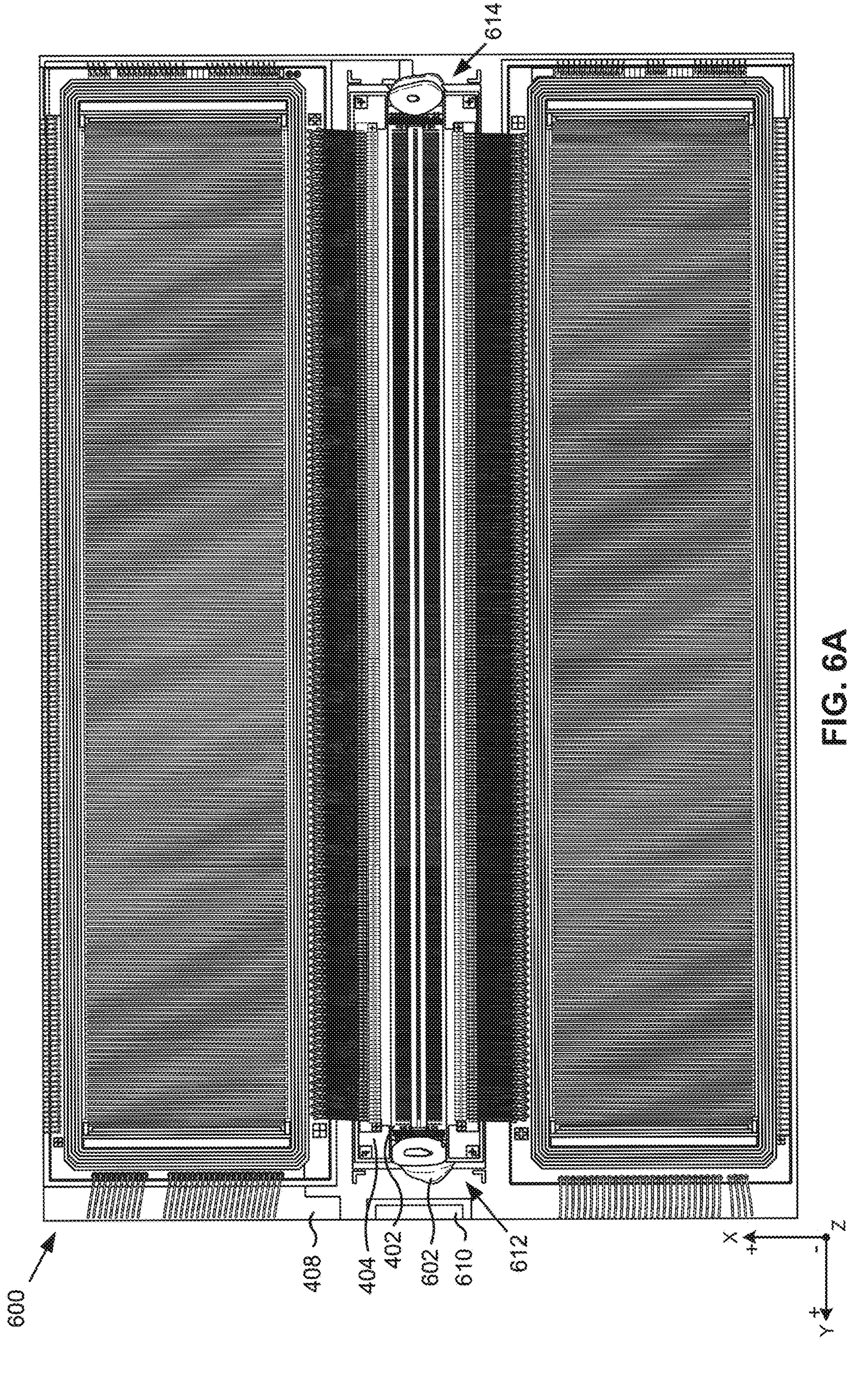
FIGS. 6A-6C are diagrams of example implementations associated with application of a light blocking material to edges of an MLA and/or PDA, in accordance with some aspects of the disclosure.
Figure 6B:
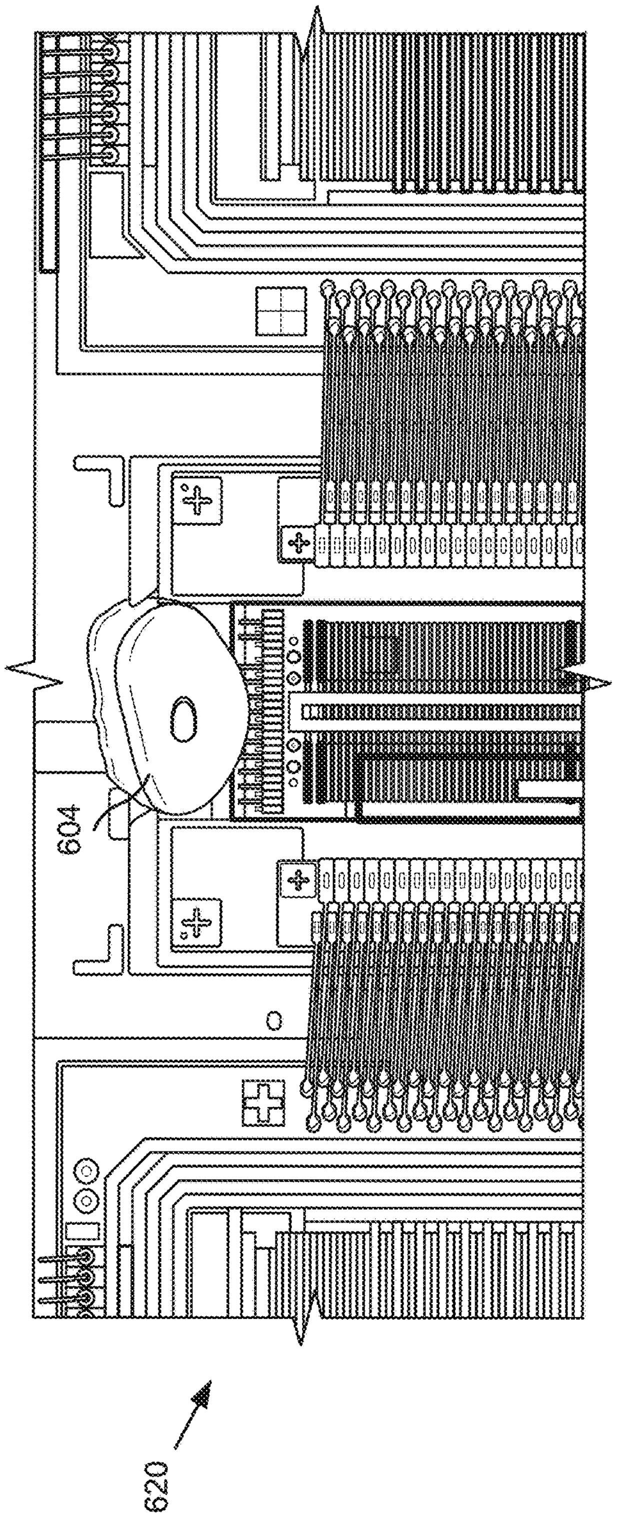
Figure 6C:
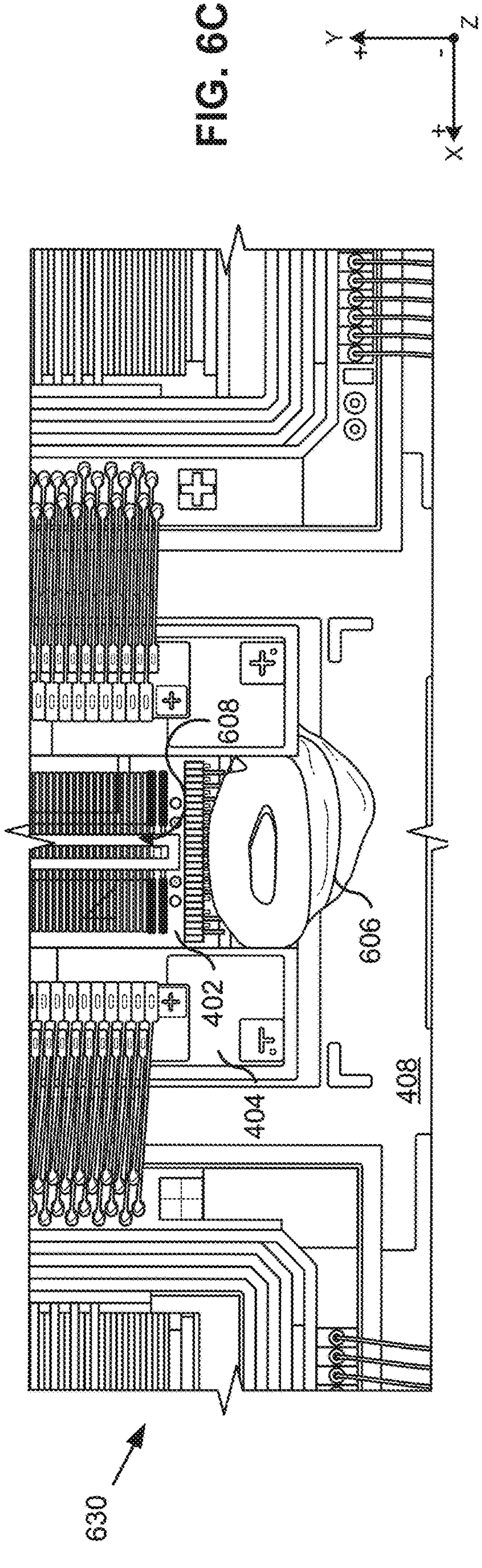

FIGS. 6A-6C are diagrams of example implementations associated with application of a light blocking material to edges of an MLA 402 and/or PDA 404, in accordance with some aspects of the disclosure. As shown in the example 600 of FIG. 6A, a light blocking material 602 is depicted as being applied to both a first distal end 612 and a second distal end 614 of an MLA 402, such that the light blocking material 602 is on top of a portion of each end of the MLA 402 and flows over an edge of the MLA 402, over an edge of the PDA 404, and onto a portion of interposer 408. As described herein, the light blocking material 602 may prevent unwanted stray light, such as light reflecting off of another component (e.g., component 610) of the lidar system, from entering the MLA 402 and/or PDA 404. Similarly, FIG. 6B depicts a first light blocking material 604 applied to a first distal end 620 of the MLA 402, PDA 404, and interposer 408, while FIG. 6C depicts a second light blocking material 606 applied to a second distal end 630 of the MLA 402, PDA 404, and interposer 408. As shown in FIGS. 6A-6C, the light blocking material (e.g., 602, 604, and/or 606) may be applied to the top of the MLA 402, without covering a pixel region 608 of the MLA 402, and flow over edge faces of the MLA 402, PDA 404, and on to the interposer 408 without coming into contact with fiducials of the various components of the lidar system.

As indicated above, FIGS. 6A-6C are provided as examples. Other examples may differ from what is described with regard to FIGS. 6A-6C. The number and arrangement of devices shown in FIGS. 6A-6C are provided as examples. In practice, there may be additional devices, fewer devices, different devices, or differently arranged devices than those shown in FIGS. 6A-6C.

Figure 7:
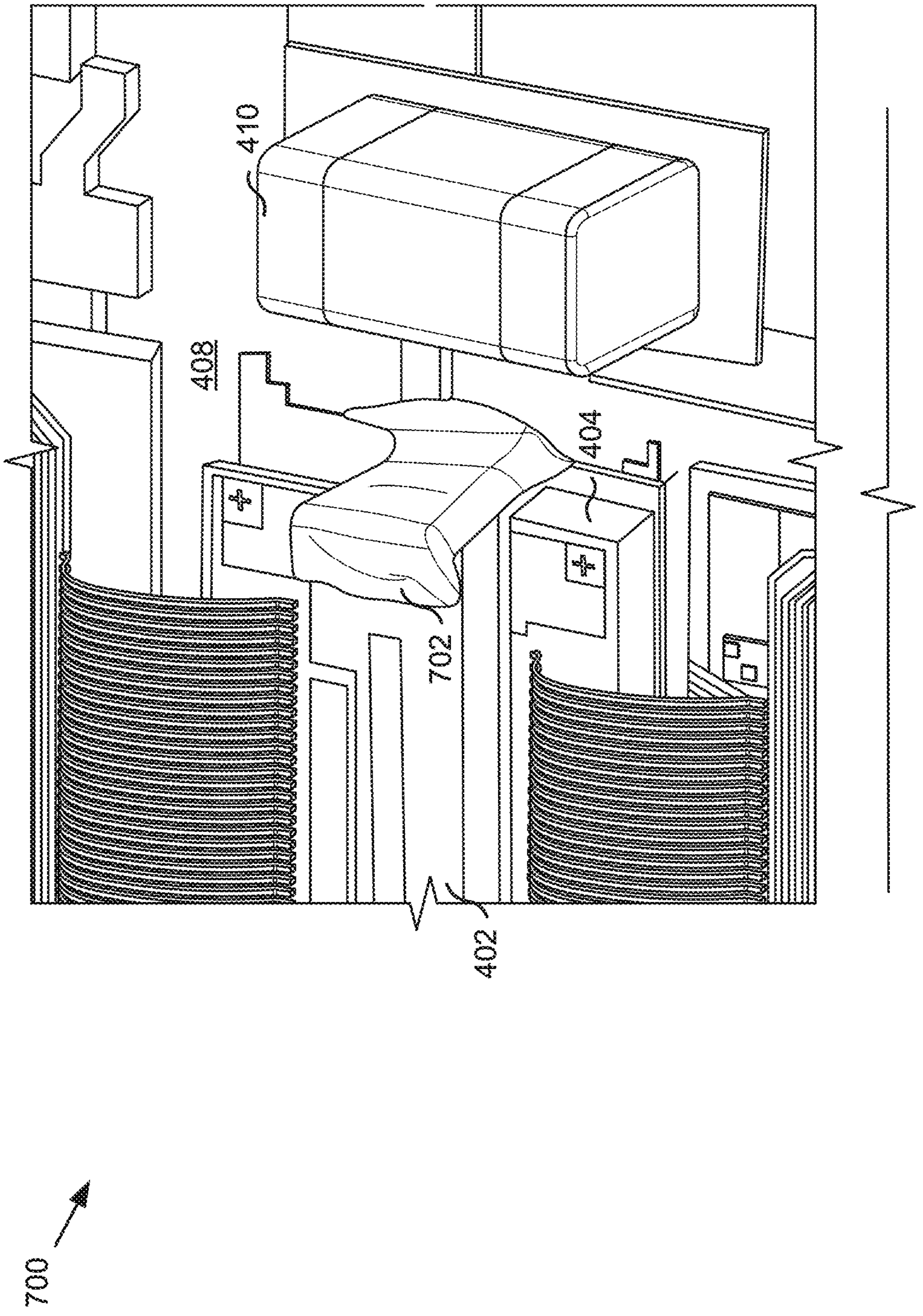
FIG. 7 is an isometric diagram of an example implementation associated with blocking stray light associated with a lidar system, in accordance with some aspects of the disclosure.

FIG. 7 is an isometric diagram of an example implementation 700 associated with blocking stray light associated with a lidar system, in accordance with some aspects of the disclosure. As shown in FIG. 7, example implementation 700 depicts an MLA 402, a PDA 404, an interposer component 408, another component 410, and a light blocking material 702. In this example, the light blocking material 702 is depicted as being applied on top of the MLA 402 and flowing over the edge faces of the MLA 402 and the PDA 404 onto the interposer 408. In some situations, the light blocking material may flow into a gap between the MLA 402 and the PDA 404 until it reaches a standoff or other feature between the components, further shielding the MLA 402 and the PDA 404 from stray light.

As indicated above, FIG. 7 is provided as an example. Other examples may differ from what is described with regard to FIG. 7. The number and arrangement of devices shown in FIG. 7 are provided as an example. In practice, there may be additional devices, fewer devices, different devices, or differently arranged devices than those shown in FIG. 7.

Figure 8:
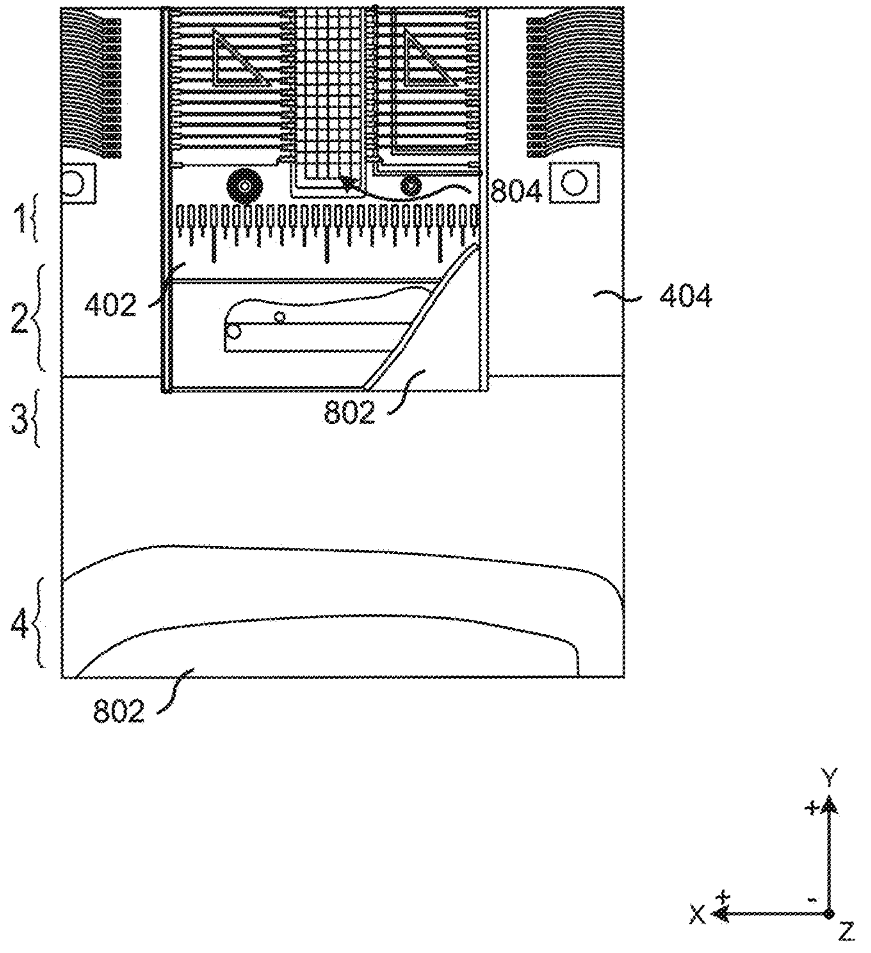
FIG. 8 is a diagram of an example end face of an MLA and PDA, in accordance with some aspects of the disclosure.

FIG. 8 is a diagram of an example end face 800 of an MLA and PDA, in accordance with some aspects of the disclosure. As shown in FIG. 8, there are four bands, or zones, identified by numerals 1, 2, 3, and 4, which indicate portions of the lidar system components extending from a pixel region 804 of the MLA 402 in the negative Y direction. Each of the identified bands may correspond to features of one or more lidar system components that might cause reflections and stray light. Accordingly, covering one or more of the four bands with light blocking material 802 may facilitate the prevention of stray light from entering the MLA 402 and/or PDA 404. As indicated, in some aspects, a center of the first band (1) may be approximately 0.13 mm (in the −Y direction) from the last pixel of the pixel region 804, a center of the second band (2) may be approximately 0.38 mm (in the −Y direction) from the last pixel of the pixel region 804, a center of the third band (3) may be approximately 0.62 mm (in the −Y direction) from the last pixel of the pixel region 804, and a center of the fourth band (4) may be approximately 1.0 mm (in the −Y direction) from the last pixel of the pixel region 804.

As indicated above, FIG. 8 is provided as an example. Other examples may differ from what is described with regard to FIG. 8. The number and arrangement of devices shown in FIG. 8 are provided as an example. In practice, there may be additional devices, fewer devices, different devices, or differently arranged devices than those shown in FIG. 8.

Figure 9:
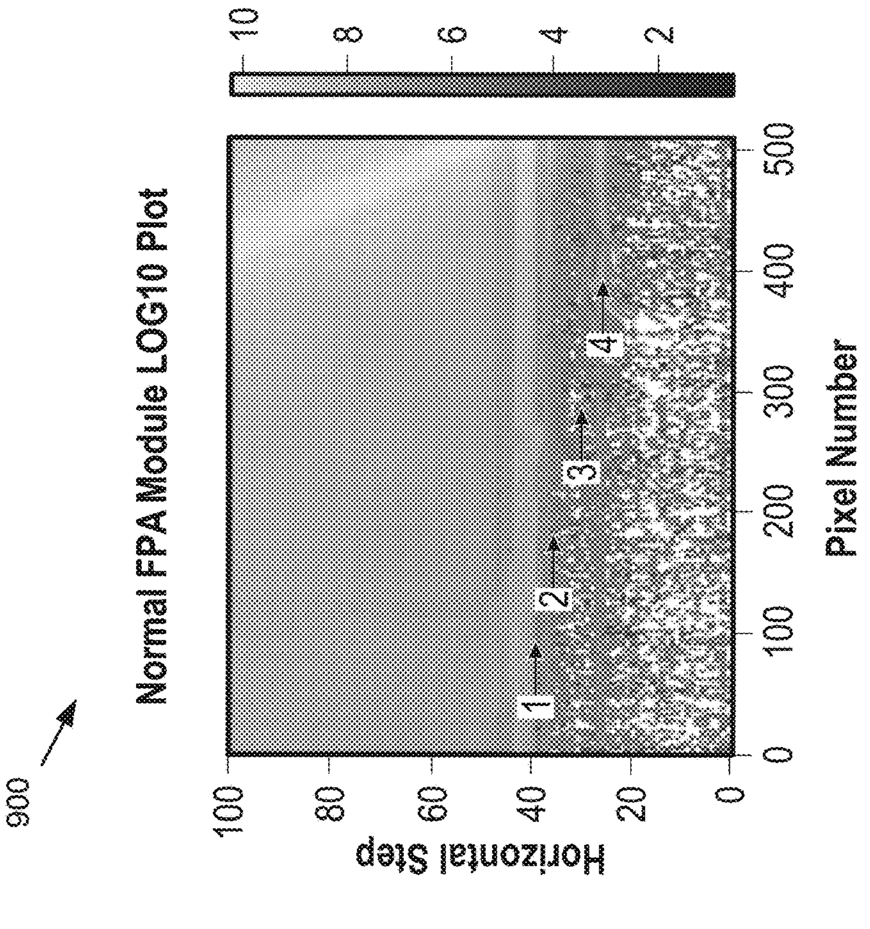
FIG. 9 is a diagram representing an example point cloud output that may be produced by a lidar system.

FIG. 9 is a diagram representing an example 900 point cloud output that may be produced by a lidar system. As shown in FIG. 9, an example of a log 10 plot of a normal (e.g., not covered by light blocking material) point cloud output is shown, with the number of pixels along the X axis and a horizontal step along the Y axis. As seen in the example 900, there are four artifacts (e.g., false objects, noise, and/or the like) shown and identified by numerals 1, 2, 3, and 4. In some aspects, the artifacts may correspond to stray light reflected from the bands described herein in association with FIG. 8. In some aspects, the artifacts may correspond to stray light generally, with no known source.

As indicated above, FIG. 9 is provided as an example. Other examples may differ from what is described with regard to FIG. 9.

Figure 10:
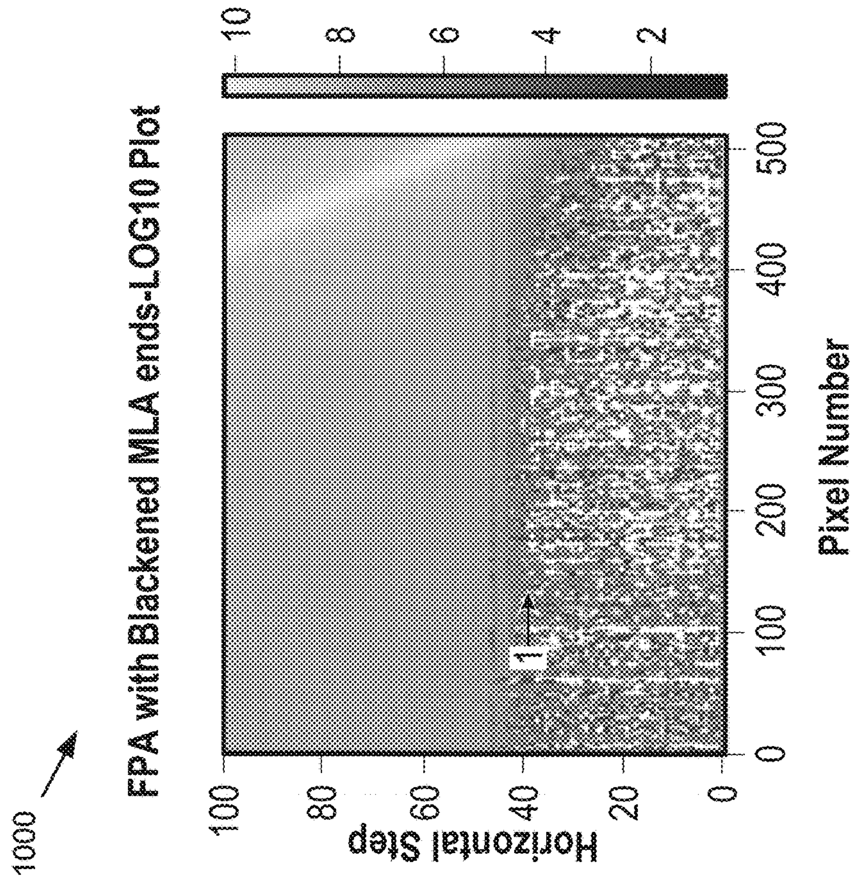
FIG. 10 is a diagram representing an example point cloud output associated with a lidar system using light blocking material, in accordance with some aspects of the disclosure.

FIG. 10 is a diagram representing an example 1000 point cloud output associated with a lidar system using light blocking material, in accordance with some aspects of the disclosure. As shown in FIG. 10, an example of a log 10 plot of a blackened (e.g., covered by light blocking material) point cloud output is shown, with the number of pixels along the X axis and a horizontal step along the Y axis. As seen in the example 1000, there is one artifact (e.g., false object, noise, and/or the like) shown and identified by numeral 1. In comparison to the plot shown in FIG. 9, the example 1000 has significantly less noise, or artifacts, due to application of the light blocking material.

As indicated above, FIG. 10 is provided as an example. Other examples may differ from what is described with regard to FIG. 10.

Figure 11:
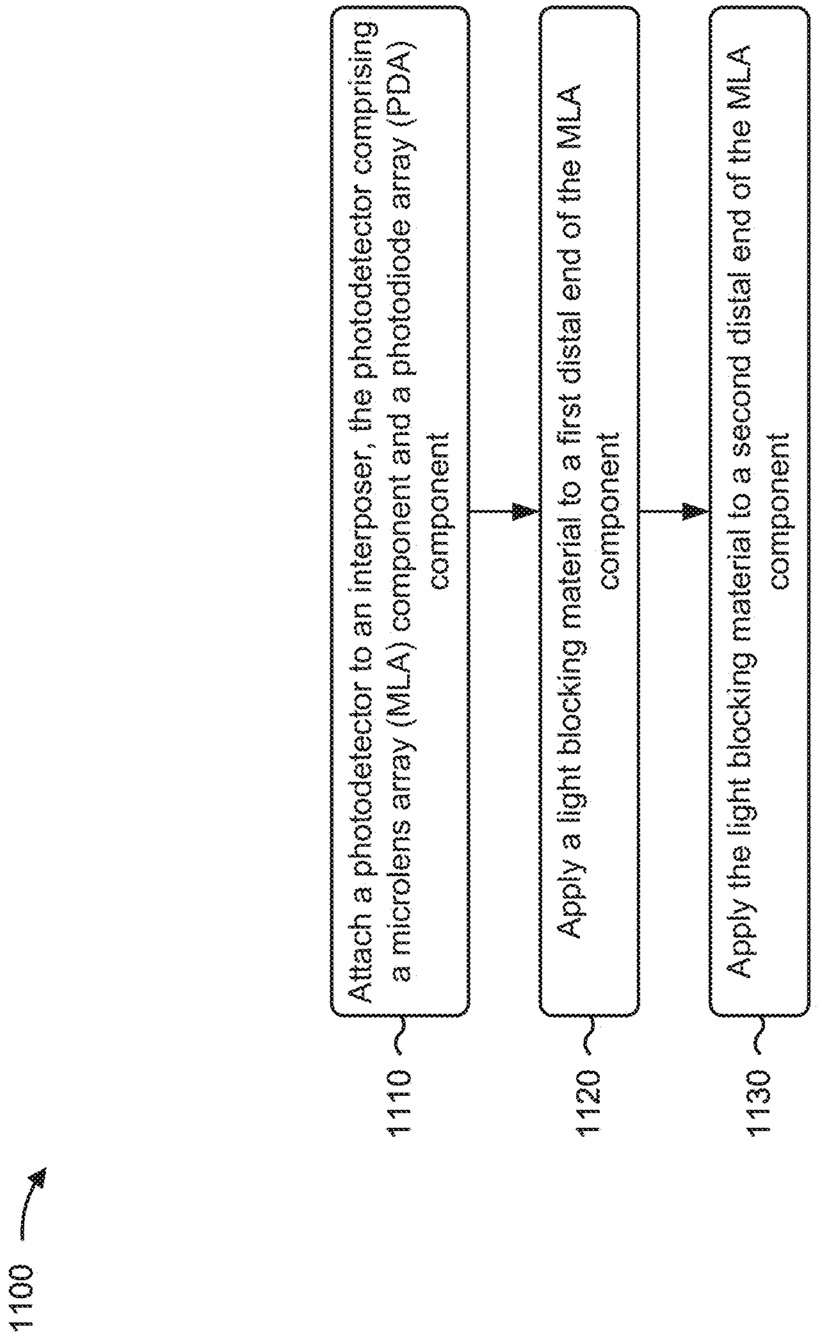
FIG. 11 is a flowchart of an example process associated with applying light blocking material to a focal plane array, in accordance with some aspects of the disclosure.

FIG. 11 is a flowchart of an example process 1100 associated with applying light blocking material to a focal plane array. In some implementations, one or more process blocks of FIG. 11 are performed automatically by a device (e.g., a manufacturing device) for fabrication and/or assembly of focal plane arrays and/or lidar system components. In some implementations, one or more process blocks of FIG. 11 are performed by another device or a group of devices separate from or including the device. Additionally, or alternatively, one or more process blocks of FIG. 11 may be performed manually (e.g., by hand).

As shown in FIG. 11, process 1100 may include attaching a photodetector to an interposer, the photodetector comprising an MLA component and a PDA component (block 1110). For example, the device may attach a photodetector to an interposer, as described above.

As further shown in FIG. 11, process 1100 may include applying a light blocking material to a first distal end of the MLA component (block 1120). For example, the device may apply a light blocking material to a first distal end of the MLA component, as described above.

As further shown in FIG. 11, process 1100 may include applying the light blocking material to a second distal end of the MLA component (block 1130). For example, the device may apply the light blocking material to a second distal end of the MLA component, as described above.

Process 1100 may include additional implementations, such as any single implementation or any combination of implementations described below and/or in connection with one or more other processes described elsewhere herein.

In a first implementation, applying the light blocking material to the first distal end of the MLA component comprises applying, using an applicator, the light blocking material to a top surface of the MLA component, proximate to a pixel region between the first distal end of the MLA component and the second distal end of the MLA component, and dragging, using the applicator, at least a portion of the light blocking material toward the first distal end of the MLA component, to cause the portion of the light blocking material to cover at least a portion of an edge face of the MLA.

In a second implementation, alone or in combination with the first implementation, the light blocking material comprises UV curable polymer, and the method further comprises curing the light blocking material.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

The following provides an overview of some Aspects of the present disclosure:

Aspect 1: A photodetector, comprising: an MLA component; a PDA component; and light blocking material applied at a first distal end of the MLA component, and a second distal end of the MLA component.

Aspect 2: The photodetector of Aspect 1, wherein the MLA component is arranged on top of the PDA component.

Aspect 3: The photodetector of any of Aspects 1-2, wherein the light blocking material is applied to a first distal end of the PDA component and a second distal end of the PDA component.

Aspect 4: The photodetector of Aspect 3, wherein a first portion of the light blocking material is applied to the first distal end of the PDA component and the first distal end of the MLA component, and wherein a second portion of the light blocking material is applied to the second distal end of the PDA component and the second distal end of the MLA component. wherein a second portion of the light blocking material is applied to the second distal end of the PDA component and the second distal end of the MLA component.

Aspect 5: The photodetector of any of Aspects 1-4, wherein the light blocking material covers a portion of a top surface of the MLA and at least a portion of an edge face of the MLA.

Aspect 6: The photodetector of Aspect 5, wherein the light blocking material covers at least a portion an edge face of the PDA.

Aspect 7: The photodetector of any of Aspects 1-6, wherein the light blocking material is disposed in a gap between the MLA component and the PDA component.

Aspect 8: The photodetector of Aspect 7, wherein a portion of the light blocking material is in contact with a standoff disposed between the MLA component and the PDA component.

Aspect 9: The photodetector of Aspect 8, wherein the standoff comprises a photolithographic polymer.

Aspect 10: The photodetector of any of Aspects 1-9, wherein the light blocking material covers a trench feature located between the MLA component and the PDA component.

Aspect 11: The photodetector of any of Aspects 1-10, wherein the light blocking material blocks short-wave infrared light.

Aspect 12: The photodetector of any of Aspects 1-11, wherein the light blocking material comprises an adhesive material.

Aspect 13: The photodetector of Aspect 12, wherein the adhesive material comprises a UV curable polymer.

Aspect 14: The photodetector of any of Aspects 1-13, wherein the light blocking material comprises a solid structure.

Aspect 15: The photodetector of any of Aspects 1-14, wherein the MLA comprises a pixel region between the first distal end of the MLA component and the second distal end of the MLA component; and wherein the light blocking material does not cover the pixel region. wherein the light blocking material does not cover the pixel region.

Aspect 16: The photodetector of any of Aspects 1-15, further comprising an interposer component to which the PDA component is attached, wherein the light blocking material is in contact with the interposer component. wherein the light blocking material is in contact with the interposer component.

Aspect 17: A method, comprising: attaching a photodetector to an interposer, the photodetector comprising: an MLA component, and a PDA component; applying a light blocking material to a first distal end of the MLA component; and applying the light blocking material to a second distal end of the MLA component.

Aspect 18: The method of Aspect 17, wherein applying the light blocking material to the first distal end of the MLA component comprises: applying, using an applicator, the light blocking material to a top surface of the MLA component, proximate to a pixel region between the first distal end of the MLA component and the second distal end of the MLA component; and dragging, using the applicator, at least a portion of the light blocking material toward the first distal end of the MLA component, to cause the portion of the light blocking material to cover at least a portion of an edge face of the MLA. applying, using an applicator, the light blocking material to a top surface of the MLA component, proximate to a pixel region between the first distal end of the MLA component and the second distal end of the MLA component; and dragging, using the applicator, at least a portion of the light blocking material toward the first distal end of the MLA component, to cause the portion of the light blocking material to cover at least a portion of an edge face of the MLA.

Aspect 19: The method of any of Aspects 17-18, wherein the light blocking material comprises a UV curable polymer; and wherein the method further comprises: curing the light blocking material. wherein the method further comprises: curing the light blocking material.

Aspect 20: A lidar system, comprising: a photodetector, comprising: an MLA component, a PDA component, and light blocking material applied at a first distal end of the MLA component, and a second distal end of the MLA component; a memory; and at least one processor coupled to the memory and configured to: receive input from the photodetector; and generate a lidar point cloud based at least in part on the input.

Aspect 21: A system configured to perform one or more operations recited in one or more of Aspects 17-19.

Aspect 22: An apparatus comprising means for performing one or more operations recited in one or more of Aspects 17-19.

Aspect 23: A non-transitory computer-readable medium storing a set of instructions, the set of instructions comprising one or more instructions that, when executed by a device, cause the device to perform one or more operations recited in one or more of Aspects 17-19.

Aspect 24: A computer program product comprising instructions or code for executing one or more operations recited in one or more of Aspects 17-19.

The foregoing disclosure provides illustration and description, but is not intended to be exhaustive or to limit the implementations to the precise forms disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The hardware and/or software code described herein for implementing aspects of the disclosure should not be construed as limiting the scope of the disclosure. Thus, the operation and behavior of the systems and/or methods are described herein without reference to specific software code—it being understood that software and hardware can be used to implement the systems and/or methods based on the description herein.

Although particular combinations of features are recited in the claims and/or disclosed in the specification, these combinations are not intended to limit the disclosure of various implementations. Features from different implementations and/or aspects disclosed herein can be combined. For example, one or more features from a method implementations may be combined with one or more features of a device, system, or product implementation. Features described herein may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination and permutation of those items, including single members. As an example, "at least one of: a, b, or c" is intended to cover a, b, c, a-b, a-c, b-c, and a-b-c, as well as any combination with multiple of the same item. As used herein, the term "and/or" used to connect items in a list refers to any combination and any permutation of those items, including single members (e.g., an individual item in the list). As an example, "a, b, and/or c" is intended to cover a, b, c, a-b, a-c, b-c, and a-b-c.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:

attaching a photodetector to an interposer, the photodetector comprising a microlens array (MLA) component, and a photodiode array (PDA) component;

applying a light blocking material to a first distal end of the MLA component; and applying the light blocking material to a second distal end of the MLA component, wherein applying the light blocking material to the first distal end of the MLA component comprises:

applying, using an applicator, the light blocking material to a top surface of the MLA component, proximate to a pixel region between the first distal end of the MLA component and the second distal end of the MLA component; and dragging, using the applicator, at least a portion of the light blocking material toward the first distal end of the MLA component, to cause the portion of the light blocking material to cover at least a portion of an edge face of the MLA component.

2. The method of claim 1, wherein the light blocking material comprises an ultraviolet (UV) curable polymer; and wherein the method further comprises curing the light blocking material using UV light after dragging the light blocking material.

3. The method of claim 1, wherein applying the light blocking material to the second distal end of the MLA component comprises: applying, using the applicator, the light blocking material to the top surface of the MLA component proximate to the pixel region; and dragging, using the applicator, at least a second portion of the light blocking material toward the second distal end of the MLA component, to cause the second portion of the light blocking material to cover at least a portion of a second edge face of the MLA component.

4. The method of claim 1, wherein the light blocking material is a viscous light blocking material, and wherein the light blocking material is a viscous light blocking material configured to flow over at least a portion of the edge face when dragged.

5. The method of claim 4, wherein the viscous light blocking material flows over portions of the PDA component and the interposer.

6. The method of claim 1, wherein the applicator comprises a dispenser or a brush.

7. The method of claim 1, wherein dragging the light blocking material is performed manually or via electromechanical mechanism.

8. The method of claim 1, wherein applying and dragging the light blocking material is controlled such that the light blocking material does not cover the pixel region of the MLA component.

9. The method of claim 1, wherein applying the light blocking material comprises avoiding covering fiducials of the MLA component or the PDA component.

10. The method of claim 1, wherein dragging the light blocking material causes the light blocking material to fill a gap between the MLA component and the PDA component and come into contact with a standoff disposed within the gap.

11. The method of claim 10, wherein contact with the standoff limits seeping of the light blocking material into regions that would interfere with functionality of the MLA component and the PDA component.

12. The method of claim 1, wherein dragging the light blocking material causes the light blocking material to cover a trench feature located between the MLA component and the PDA component.

* * * * *